United States Patent
Kim et al.

(10) Patent No.: US 6,327,191 B1
(45) Date of Patent: Dec. 4, 2001

(54) ADDRESS SIGNAL GENERATOR IN A SEMICONDUCTOR MEMORY

(75) Inventors: Yeon-Ok Kim; Tae-Hyung Jung, both of Chungcheongbuk-do (KR)

(73) Assignee: Hyundai Electronic Industries Co., Ltd., Kyoungki-Do (KR)

( * ) Notice: Subject to any disclaimer, the term of this patent is extended or adjusted under 35 U.S.C. 154(b) by 0 days.

(21) Appl. No.: 09/644,743

(22) Filed: Aug. 24, 2000

(30) Foreign Application Priority Data

Aug. 25, 1999 (KR) .................................................. 99-35433

(51) Int. Cl.$^7$ ...................................................... G11C 16/04
(52) U.S. Cl. .................... 365/189.05; 365/190; 327/239; 327/256
(58) Field of Search ..................................... 365/194, 190, 365/233, 233.5, 189.05; 327/239, 256, 257, 259

(56) References Cited

U.S. PATENT DOCUMENTS 5,047,986 * 9/1991 Miyamoto et al. .................. 365/226
5,949,731 * 9/1999 Tsukude .......................... 365/230.01

\* cited by examiner

*Primary Examiner*—Richard Elms
*Assistant Examiner*—Hien Nguyen
(74) *Attorney, Agent, or Firm*—Morgan, Lewis & Bockius LLP

(57) ABSTRACT

A semiconductor memory includes a control signal generator for generating a first control signal, a second control signal, and a third control signal; a first inverter for receiving an external address in accordance with the first control signal; a latch enabled by the second control signal and latching an output of the first inverter; and an address signal generator enabled by the third control signal, the address signal generator generating complementary address signals by using outputs of the first inverter and the latch.

9 Claims, 6 Drawing Sheets

ADDRESS SIGNAL GENERATOR IN A SEMICONDUCTOR MEMORY

This Application claims the benefit of Koren Patent Application No. 99-35433 filed on Aug. 25, 1999, which is hereby incorporated by reference.

BACKGROUND OF THE INVENTION

1. Field of the Invention

The present invention relates to a semiconductor memory, more particularly, to an address signal generator in a semiconductor memory which is capable of generating address signals with a high speed.

2. Discussion of Related Art

When a read or a write operation is controlled by a CPU in a semiconductor memory, there exists a timing margin, i.e., so-called set-up time and holding time, for performing synchronization with a clock. The set-up time is a time for confirming a data before the generation of a control signal. The holding time is a time during which the confirmed data maintains its state after the generation of the control signal.

FIG. 1 shows a circuit for an address signal generator in a semiconductor memory according to a related art.

Referring to FIG. 1, an address signal generator consists of NOR gates 108 and 112 and inverters 110 and 114. In the address signal generator, an external address BXIN is transformed into address signals BXT and BXB. The external address BXIN is inputted to an inverter 102. Then, the address BXIN is latched by a latch consisting of inverters 104 and 106. An output of the inverter 102 is inputted to the NOR gate 112. An output of the latch, i.e., the output of the inverter 104, is inputted to the other NOR gate 108. The inverter 102 and the inverter 106 of the latch are tri-state inverters which are enabled by an address enabling signal XAEI and its inverted signal.

The inverter 102 is enabled provided that the address enabling signal XAEI is at a low level. The inverter 106 of the latch is enabled when the address enabling signal XAEI is at a high level, thereby latching the external address BXIN inputted through the inverter 102. Namely, during a period defined by the address enabling signal XAEI, the inputting and the latching operations of the external address BXIN are completed.

An inverted signal of the address enabling signal XAEI enables the inverter 106 of the latch as soon as it is inputted to the NOR gates 108 and 112 which actually generate an address. Thus, the output of an inverter 116 should be at a low level so that the outputs of the inverter 102 and the inverter 104 of the latch are outputted as the address signals BXT and BXB. Namely, the output of the inverter 116 which is an inverted signal of the address enabling signal XAEI enables the address signal generator as well.

Therefore, the outputs of the inverters 102 and 104 are outputted as the address signals BXB and BXT respectively while the output of the inverter 116 is at a low level (which means that the address enabling signal XAEI is at a high level).

FIG. 2 is a timing diagram showing operational characteristics of an address signal generator in a semiconductor memory according to a related art. In FIG. 2, t1 is a set-up time. Referring to FIG. 2, an external address BXIN is first generated. Thereafter, address signals BXT and BXB are generated after a time interval t3 following the time point at which an address enabling signal XAEI goes up to a high level.

Namely, the external address BXIN has been confirmed at first. After a predetermined time t1, the address enabling signal XAEI goes up to a high level. After the address enabling signal XAEI has gone to the high level, the logic value is maintained for a predetermined time t2. In this case, t1 and t2 represent the so-called set-up time and holding time, respectively.

The logic values of the address signals BXT and BXB are complementary to each other. BXT and BXB are at low and high levels respectively provided that the external address BXIN is at a low level. Otherwise, BXT and BXB are at high and low levels respectively provided that the external address BXIN is at a high level.

Once the address enabling signal XAEI goes to a low level, the address signals BXT and BXB are fixed to a high level regardless of the logic value of the external address BXIN.

As shown in FIG. 2, the address signals BXT and BXB are generated after a time of t3 from a time point at which the address enabling signal XAEI has gone up to a high level. This is because it takes some time for the outputs of the NOR gates 108 and 112 in FIG. 1 to be enabled by the address enabling signal XAEI.

FIG. 3 shows a circuit for generating an address enabling signal XAEI in a semiconductor memory according to a related art.

Referring to FIG. 3, four buffers 302a to 302d are connected in series and are used as delaying means which decide the value of ti (i.e., t1 through t3 shown in FIG. 2) by sizes of the delaying means. Namely, the size of ti is controlled by manipulating the sizes of the buffers 302a to 302d.

A bank selection signal BANKi is inputted to the first buffer 302a and is enabled by a chip enabling signal ACT. An output of the fourth buffer 302d is the address enabling signal XAEI. The output of the buffer 302d may be outputted as a sense amplifier enabling signal SAE and a word line enabling signal WLE through other buffers 304, 306 and 308.

As mentioned in the above description, the delay of generating the address signals BXT and BXB by the address enabling signal XAEI hinders high-speed signals required for a high-speed system, memory devices, etc.

SUMMARY OF THE INVENTION

Accordingly, the present invention is directed to a semiconductor memory that substantially obviates one or more of the problems due to limitations and disadvantages of the related art.

An object of the present invention is to provide an address signal generator in a semiconductor memory which prevents the delayed-generation of address signals by enabling the address signals BXT and BXB using an address signal generation enabling signal which is faster than the conventional address enabling signal, before the logic values of the address signals BXT and BXB are confirmed as the address enabling signal XAEI goes up to a high level.

Another object of the present invention is to provide an improved address signal generator in a semiconductor memory which is enabled by an address signal generation enabling signal produced by a bank selection signal and a chip enabling signal.

Additional features and advantages of the invention will be set forth in the description which follows and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the present invention includes an address signal generator for receiving an external address which is inputted by a first control signal and is latched by a second control signal wherein the address signal generator is enabled by a third control signal and generates complementary address signals in use of the latched signal.

In another aspect, the present invention includes a control signal generator for generating a first control signal controlling an input of an external address and a second control signal latching the inputted external address, a latch enabled by the second control signal and latching an output of a first inverter, and an address signal generator enabled by a third control signal wherein the address signal generator generates complementary address signals in use of outputs of the first inverter and the latch.

It is to be understood that both the foregoing general description and the following detailed description are exemplary and explanatory and are intended to provide further explanation of the invention as claimed.

BRIEF DESCRIPTION OF THE ATTACHED DRAWINGS

The accompanying drawings, which are included to provide a further understanding of the invention and are incorporated in and constitute a part of this application, illustrate embodiments of the inventing and together with the description serve to explain the principle of the invention. In the drawings.

DETAILED DESCRIPTION OF PREFERRED EMBODIMENTS

Reference will now be made in detail to the preferred embodiments of the present invention, examples of which are illustrated in the accompanying drawings.

Figure 4:
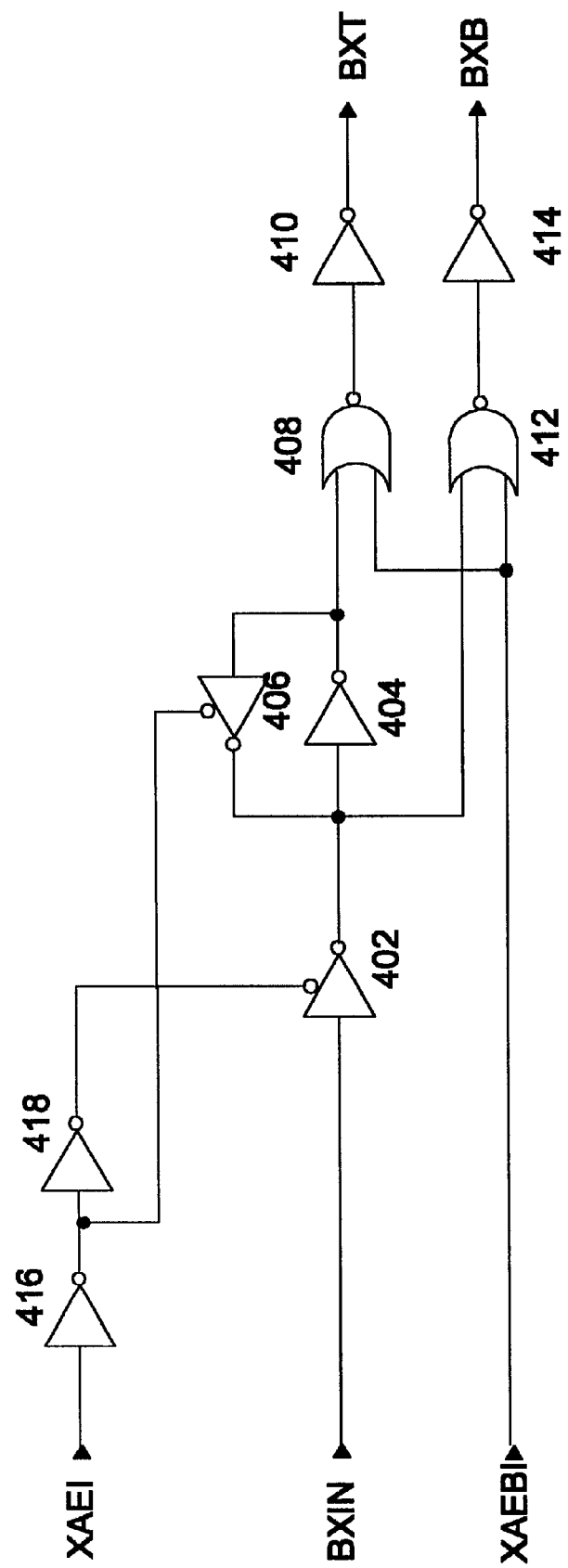
FIG. 4 shows a circuit for an address signal generator in a semiconductor memory according to the present invention.

FIG. 4 shows a circuit for an address signal generator in a semiconductor memory according to the present invention.

Referring to FIG. 4, an address signal generator of the present invention includes NOR gates 408 and 412 and inverters 410 and 414. In the address signal generator, an external address BXIN is transformed into address signals BXT and BXB. The external address BXIN is inputted to an inverter 402. Then, the address BXIN is latched by a latch formed of inverters 404 and 406. An output of the inverter 402 is inputted to the NOR gate 412. An output of the latch, i.e., the output of the inverter 404, is inputted to the other NOR gate 408. The inverter 402 and the inverter 406 of the latch are tri-state inverters which are enabled by an address enabling signal XAEI and its inverted signal.

The inverter 402 is enabled provided that the address enabling signal XAEI is at a low level. The inverter 406 of the latch is enabled when the address enabling signal XAEI is at a high level, thereby latching the external address BXIN inputted through the inverter 402. Namely, during a period defined by the address enabling signal XAEI, the inputting and the latching operations of the external address BXIN are completed.

An address signal generation enabling signal XAEBI is inputted to the NOR gates 408 and 412 which actually generate an address signal. The state transition of the address signal generation enabling signal XAEBI occurs earlier than that of the address enabling signal XAEI does. Thus, the address signal generation enabling signal XAEBI should be at a low level so that the outputs of the inverter 402 and the inverter 404 of the latch are outputted as the address signals BXT and BXB.

Figure 5:
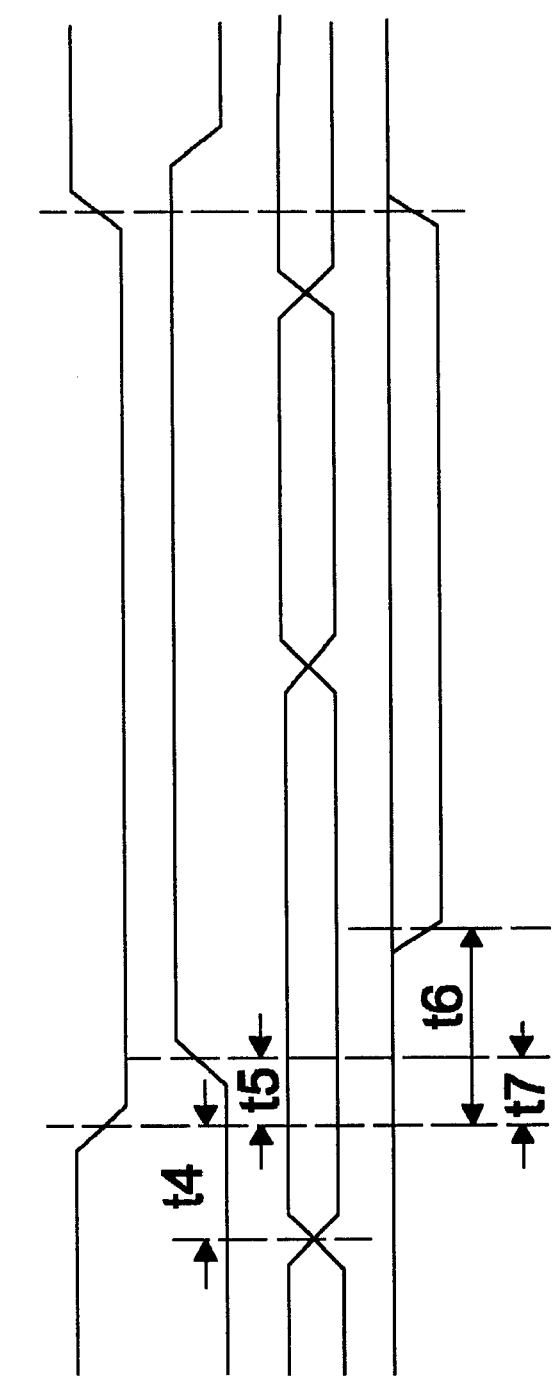
FIG. 5 is a timing diagram showing operational characteristics of an address signal generator in a semiconductor memory according to the present invention.

FIG. 5 is a timing diagram illustrating operational characteristics of an address signal generator in a semiconductor memory according to the present invention. In FIG. 5, t4 is a set-up time.

Referring to FIG. 5, when an external address BXIN is fixed to a predetermined level, an address signal generation enabling signal XAEBI goes down to a low level. Then, an address enabling signal XAEI goes up to a high level. In this case, the logic values of the address signals BXT and BXB are confirmed as soon as the address enabling signal XAEI goes up to a high level.

The address signals BXT and BXB are enabled earlier than the address enabling signal XAEI. This is because the NOR gates 408 and 412 are enabled by the address signal generation enabling signal XAEBI before the address enabling signal XAEI goes up to a high level.

The logic values of the address signals BXT and BXB are complementary to each other. BXT and BXB are at low and high levels respectively provided that the external address BXIN is at a low level. Otherwise, BXT and BXB are at high and low levels respectively provided that the external address BXIN is at a high level.

Once the address signal generation enabling signal XAEBI goes to a high level again, the address signals BXT and BXB are fixed to a high level regardless of the logic value of the external address BXIN.

Figure 1:
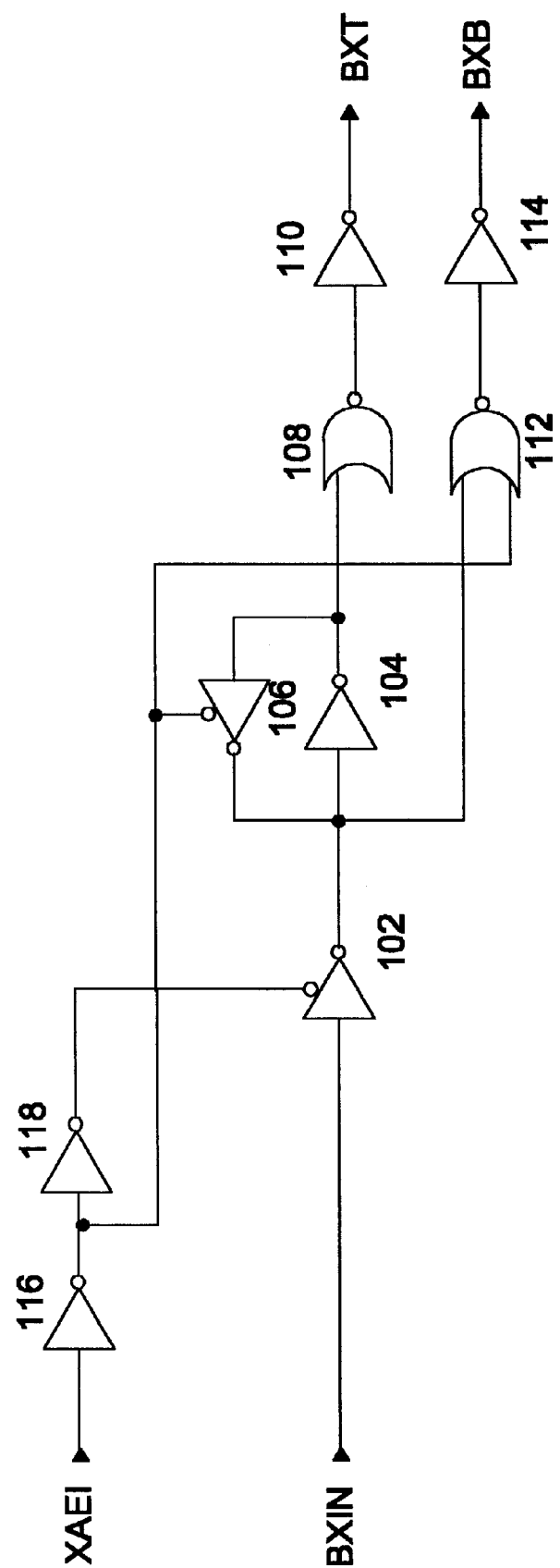
FIG. 1 shows a circuit for an address signal generator in a semiconductor memory according to a related art.
Figure 2:
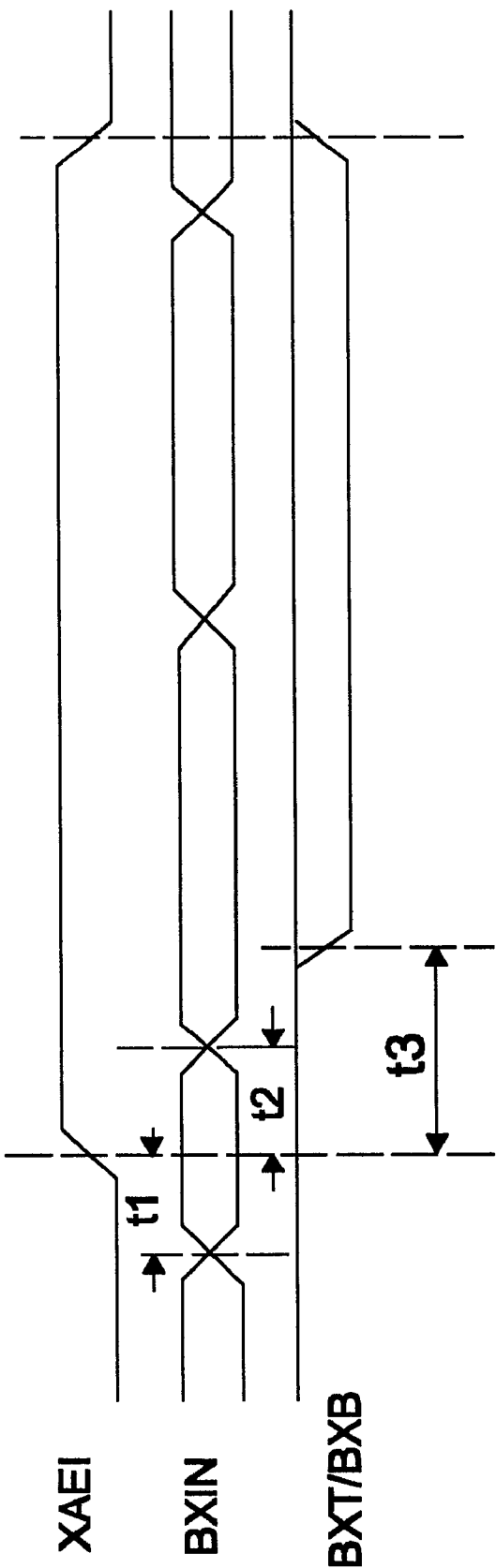
FIG. 2 is a timing diagram showing operational characteristics of an address signal generator in a semiconductor memory according to a related art.
Figure 3:
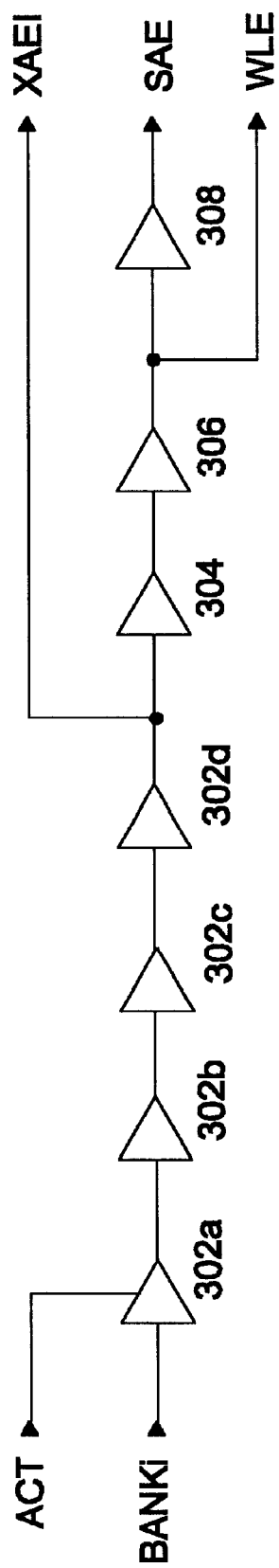
FIG. 3 shows a circuit for generating an address enabling signal XAEI in a semiconductor memory according to a related art.

The absolute size of t3 in FIG. 2 is the same as that of t6 in FIG. 5, while the transition time point of t6 in FIG. 5 is faster than that of t3 by an amount of t7. The time interval t7 corresponds to the time gap during which the address signal generation enabling signal XAEBI is activated faster than the address enabling signal XAEI is.

Figure 6:
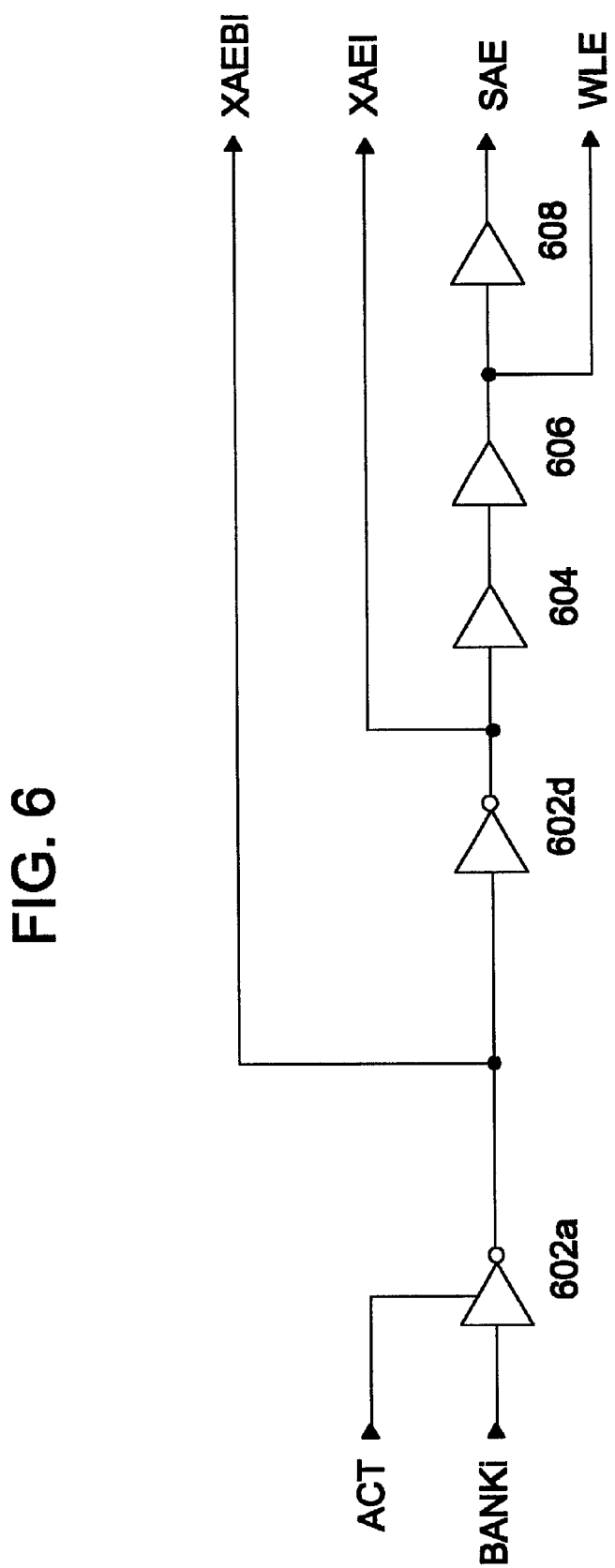
FIG. 6 shows a path circuit for generating an address enabling signal XAEI and an address signal generation enabling signal XAEBI in a semiconductor memory according to the present invention.

FIG. 6 shows a path circuit for generating an address enabling signal XAEI and an address signal generation enabling signal XAEBI in a semiconductor memory according to the present invention.

Referring to FIG. 6, two buffers 602a and 602b are connected in series and are used as delaying means which decide the length of t7 in FIG. 5.

A bank selection signal BANKi is inputted to the first buffer 602a and is enabled by a chip enabling signal ACT.

An output of the first buffer 602a is the address signal generation enabling signal XAEBI. An output of the second buffer 602b is an address enabling signal XAEI. The output of the second buffer 602b may be outputted as a sense amplifier enabling signal SAE and a word line enabling signal WLE through other buffers 604, 606 and 608.

Accordingly, the present invention reduces signal delay significantly, as compared to the case when the address signal generator is enabled by the address enabling signal XAEI. This result is achieved in the present invention by allowing the address signal generator to be activated by the address signal generation enabling signal XAEBI faster than the address enabling signal XAEI.

It will be apparent to those skilled in the art that various modifications and variations can be made in a semiconductor memory of the present invention without departing from the spirit or scope of the inventions. Thus, it is intended that the present invention cover the modifications and variations of this invention provided that they come within the scope of the appended claims and equivalents.

What is claimed is:

1. An address signal generator for generating complementary address signals, comprising:

a first input terminal for receiving an external address signal;

a second input terminal for receiving a first control signal, wherein the first control signal controls receipt of the external address signal;

a latch controlled by a second control signal related to the first control signal for generating a latched external address signal; and a third input terminal for receiving a third control signal, wherein the third control signal enables generation of complementary address signals by using the latched external address signal.

2. The address signal generator of claim 1, wherein the external address signal is inputted as a first inverter is enabled by the first control signal and wherein an output of the first inverter is latched when the latch is enabled by the second control signal.

3. The address signal generator of claim 1, wherein the second control signal is an inverted signal of an address enabling signal and the first control signal is an inverted signal of the second control signal.

4. The address signal generator of claim 3, wherein the address enabling signal is activated between a set-up time and a holding time of the external address signal as a bank selection signal is delayed by a delaying means.

5. The address signal of claim 3, wherein the third control signal is activated between a first time point at which the external address signal is inputted and a second time point at which the first control signal is activated.

6. A semiconductor memory comprising:

a control signal generator for generating a first control signal, a second control signal, and a third control signal;

a first inverter for receiving an external address in accordance with the first control signal;

a latch enabled by the second control signal and latching an output of the first inverter; and an address signal generator enabled by the third control signal, the address signal generator generating complementary address signals by using outputs of the first inverter and the latch.

7. The semiconductor memory of claim 6, wherein the second control signal is an inverted signal of an address enabling signal and the first control signal is an inverted signal of the second control signal.

8. The semiconductor memory of claim 6, wherein the address enabling signal is activated between a set-up time and a holding time of the external address as a bank selection signal is delayed by a delaying means.

9. The semiconductor memory of claim 6, wherein the third control signal is activated between a first time point at which the external address is inputted and a second time point at which the first control signal is activated.

* * * * *